United States Patent [19]
Sakurada et al.

[11] 4,096,559
[45] Jun. 20, 1978

[54] POWER SUPPLY CIRCUIT

[75] Inventors: Hiroshi Sakurada; Toshihiko Tojo, both of Mobara, Japan

[73] Assignee: Hitachi, Ltd., Japan

[21] Appl. No.: 804,385

[22] Filed: Jun. 7, 1977

[30] Foreign Application Priority Data

Jul. 23, 1976 Japan .................................. 51-87265

[51] Int. Cl.$^2$ ........................................... H02M 7/515
[52] U.S. Cl. ....................................... 363/96; 363/28; 363/124
[58] Field of Search ............... 307/252 M; 363/27, 28, 363/96, 124, 135, 136, 138, 139

[56] References Cited

U.S. PATENT DOCUMENTS

| | | | |
|---|---|---|---|
| 3,480,850 | 11/1969 | Gaboriaud | 363/139 X |
| 3,864,619 | 2/1975 | Tanaka et al. | 363/135 |
| 3,881,146 | 4/1975 | Wanlass | 363/28 |

Primary Examiner—William M. Shoop
Attorney, Agent, or Firm—Craig & Antonelli

[57] ABSTRACT

A power supply circuit for a high voltage driven device, particularly a magnetron, is described. The power supply circuit comprises first and second switching elements, an inverter circuit including a commutating reactor connected in series with the first and second switching elements and a capacitor connected to a center tap of the commutating reactor, a transformer connected to an output of the inverter circuit, and a third switching element connected in parallel with a series circuit comprising the capacitor, the primary winding of the transformer and a portion of the commutating reactor. When the magnitude of a current flowing in the transformer exceeds a predetermined level, the third switching element is fired to establish a discharge loop for the capacitor through the series circuit whereby the amplitude of the current supplied to the transformer is limited below the predetermined level.

9 Claims, 13 Drawing Figures

POWER SUPPLY CIRCUIT

The present invention relates to a power supply circuit, and more particularly to a power supply circuit for a magnetron.

The magnetron is a high voltage driven device and the power supply circuit therefor includes a large size transformer for stepping up a commercial line voltage and hence it is large in size and heavy in weight.

In order to overcome the above drawbacks, it has been practiced to convert a D.C. voltage or a commercial line voltage to a high frequency voltage which is then supplied to a transformer to reduce the size of the transformer. One example of the power supply circuit of this type is explained with reference to the accompanying drawings.

FIG. 1(a) is a circuit diagram illustrating an example of a power supply circuit of the prior art.

FIGS. 1(b) and (c) show prior art D.C. power supply circuits.

Figure 1A:
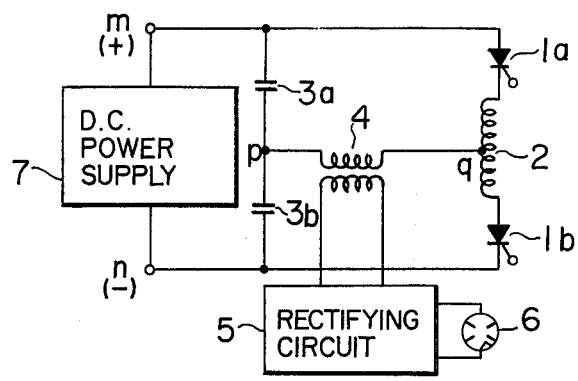

Referring to FIG. 1(a), numeral 7 denotes a D.C. power supply having a positive potential output terminal $m$ and a negative potential output terminal $n$, 1a and 1b denote thyristors connected to opposite ends of a commutating reactor 2 in series therewith, with the terminal $m$ being connected to an anode of the thyristor 1a while the terminal $n$ being connected to a cathode of the thyristor 1b, 3a and 3b denote commutating capacitors connected in series with each other across the terminals $m$ and $n$, a primary winding of a transformer 4 being connected between a junction $p$ of the capacitors 3a and 3b and a center tap $q$ of the reactor 2. A stepped-up voltage produced across a secondary winding of the transformer 4 in accordance with an input voltage to the primary winding thereof is rectified by a rectifier circuit 5 and supplied to a magnetron 6. The D.C. power supply 7 may be a known commercial line voltage rectifying circuit such as that shown in FIGS. 1(b) or (c). The rectifying circuit to a load may be any known rectifying circuit such as a bridge rectifying circuit or a half-wave rectifying circuit. In certain cases, the rectifying circuit may be omitted and the output of the transformer 4 may be directly supplied to the load.

Figure 2:
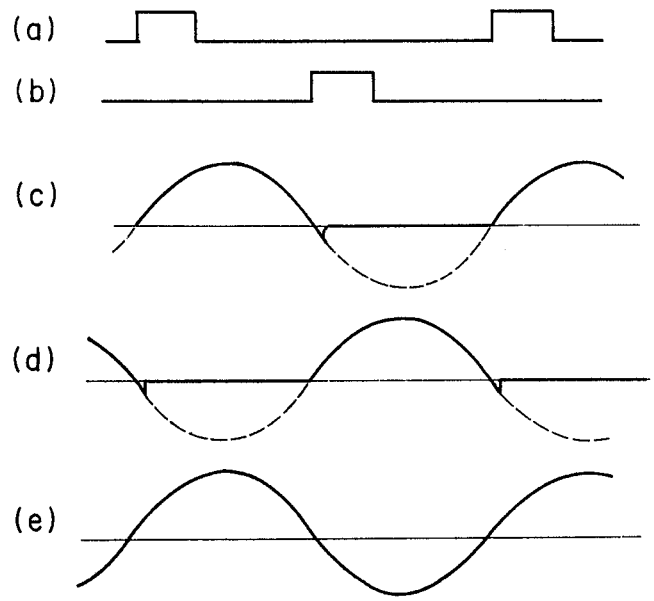
FIG. 2 shows waveforms for explaining the operation of the power supply circuit of FIG. 1(a).

The operation of the power supply circuit thus constructed is explained below. A control signal having a waveform shown in FIG. 2(a) is applied to a gate of the thyristor 1a while a control signal having a waveform shown in FIG. 2(b) is applied to a gate of the thyristor 1b. The thyristor 1a first conducts by the signal shown in FIG. 2(a) so that a current shown in FIG. 2(c) having an oscillation waveform determined by the reactor 2 and the capacitor 3a and 3b flows through the thyristor 1a. In FIG. 2(c), a forward current of the thyristor 1a is shown in a positive direction when the current flows backward by the oscillation, the thyristor 1a is reverse-biased and rendered non-conductive. At this time, the thyristor 1b conducts by the control signal shown in FIG. 2(b) and an oscillating current shown in FIG. 2(d) flows through the thyristor 1b. In FIG. 2(d), a forward current of the thyristor 1b is shown in the positive direction. When the current flows backward, the thyristor 1b is rendered non-conductive in the same manner as described above. The above cycles are repeated resulting in a high frequency oscillating current shown in FIG. 2(e) in the step-up transformer 4. In FIG. 1(a), the capacitor 3a may be omitted. The principle of operation in such a circuit is similar to that described above.

Figure 3:
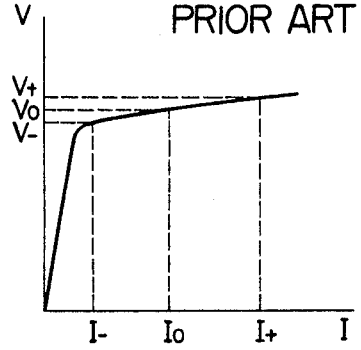
FIGS. 3 and 4 show voltage-current characteristics of a magnetron.
Figure 4:
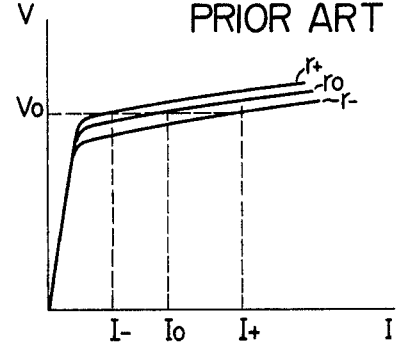

The power supply circuit described above, however, has a drawback in that the current supplied to the magnetron 6 considerably changes with the variation of a power supply voltage and the variation of the load. FIG. 3 shows a voltage (V) — current (I) characteristic of a magnetron and FIG. 4 shows a voltage (V) — current (I) characteristic with temperature or load being a parameter. In FIG. 4, $r_o$, $r_+$, $r_-$ represent temperatures or loads. As seen from FIG. 3, when the voltage changes to $V_+$ or $V_-$ around an optimum reference voltage $V_o$ by the voltage variation, the current greatly changes from $I_o$ to $I_+$ or $I_-$. Also, as seen from FIG. 4, when the voltage (V) — current (I) characteristic changes to $r_+$ or $r_-$ around $r_o$ by the temperature change or the change of load, the current changes greatly from $I_o$ to $I_+$ or $I_-$. When such a great change of current occurs, the output of the magnetron greatly changes and an excessive current may flow in the magnetron causing an abnormal state called moding, which may lead to the breakdown of the magnetron.

It is therefore, an object of the present invention to provide a power supply circuit capable of controlling the variation of a current within a sufficiently small range, which current is to be supplied to a load of a high voltage driven device such as a magnetron.

In order to attain the above object, according to the present invention, there is provided a power supply circuit comprising a single-phase sereis type inverter circuit including first and second switching elements, a commutating reactor connected in series therewith and a capacitor connected to a center tap of the commutating reactor, and a transformer connected to an output of the single-phase series type inverter circuit, wherein a third switching element is connected in parallel with a series circuit including the capacitor, the primary winding of the transformer and a portion of the commutating reactor such that the third switching element is turned on when a current flowing in the transformer exceeds a predetermined level to reduce an energy stored in the capacitor.

The preferred embodiments of the present invention will be explained in detail with reference to the accompanying drawings. Throughout the drawings, the same reference numerals represent like parts.

Figure 1B:
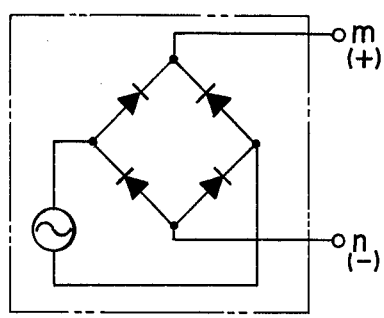
Figure 1C:
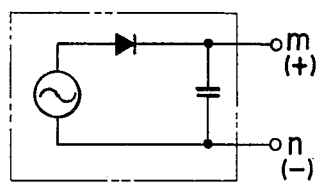
Figure 5:
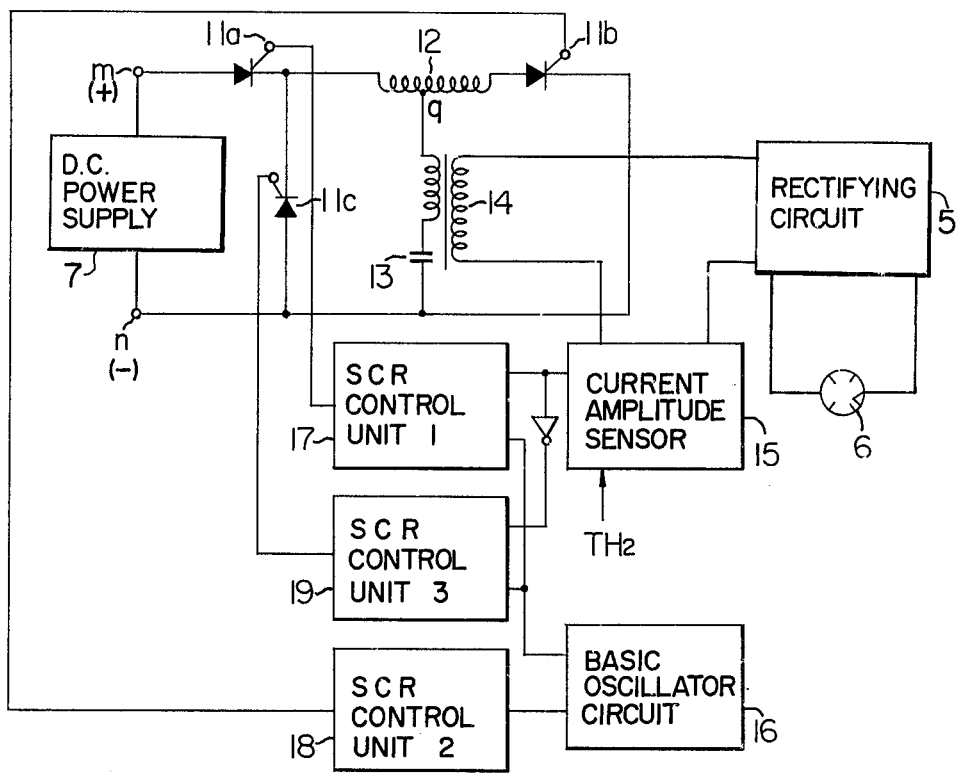
FIG. 5 shows one embodiment of a power supply circuit of the present invention.

FIG. 5 shows one embodiment of the power supply circuit of the present invention, particularly that for the magnetron. The same reference numerals as those shown in FIG. 1 represent the like parts. In FIG. 5, numeral 7 denotes the D.C. power supply having the positive output terminal $m$ and the negative output terminal $n$, 11a and 11b denote the thyristors connected to the opposite ends of the reactor 12 in series therewith, with the cathode of the thyristor 11a connected to one end of the reactor 12 while the anode of the thyristor 11b is connected to the other end of the reactor 12, and with the anode of the thyristor 11a connected to the terminal m of the D.C. power supply 7 while the cathode of the thyristor 11b is connected to the terminal n of the D.C. power supply 7. Numeral 13 denotes a capacitor having one end thereof connected to the center tap of the reactor 12 through the primary winding of the transformer 14 and the other end thereof connected to the terminal n. Those components constitute a known single-phase series type inverter circuit. The D.C. power supply 7 may be any known power supply such as that shown in FIGS. 1(b) or (c) as described above. The secondary winding of the transformer 14 is connected to the rectifying circuit 5, which is well known per se, and the output of the rectifying circuit 5 is connected to the load. In certain cases, the rectifying circuit 5 may be omitted and the secondary winding of the transformer 14 may be directly connected to the load. Numeral 11c denotes a thyristor having a cathode thereof connected to the junction of the thyristor 11a and the reactor 12 and an anode thereof connected to the negative potential terminal n, and it is connected in parallel with a series circuit including the capacitor 13, the primary winding and a portion of the commutating reactor. Numeral 15 denotes a sensor for detecting whether the amplitude of current flowing in the magnetron exceeds a predetermined level or not, numeral 16 denotes a basic oscillator circuit for determining the operation cycle of the thyristors, and numerals 17 to 19 denote thyristor control units for controlling the start of operation of the thyristors 11a to 11c, respectively.

The operation of the power supply circuit of the construction described above is explained with reference to the waveforms shown in FIGS. 6(a) to (e). Of those figures, FIGS. 6(a) to (c) represent control signal waveforms at the outputs of the thyristor control units 17 to 19, which are supplied to the gates of the thyristors 11a to 11c, FIG. 6(d) represents a voltage waveform of the capacitor 13, and FIG. 6(e) represents a current waveform flowing in the transformer 14.

Figure 6:
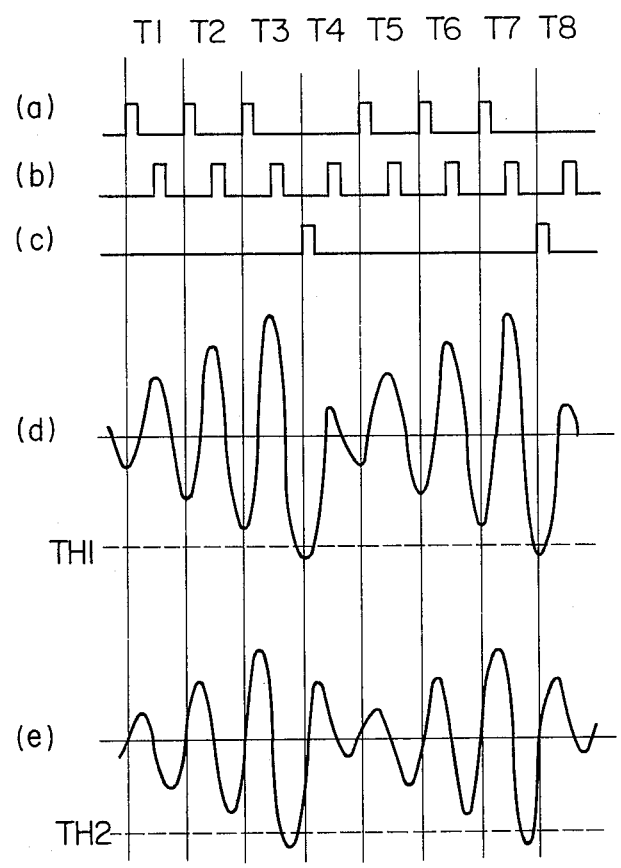
FIG. 6 shows waveforms for explaining the operation of the power supply circuit of FIG. 5.

When the amplitude of the current flowing in the transformer 14 is below a predetermined amplitude $TH_2$, the gates of the thyristors 11a and 11b alternately receive the gate signals as shown in FIGS. 6(a) and (b) which are produced at the signal output terminals of the thyristor control units 17 and 18, respectively under the control of the output signal of the basic oscillator circuit 16, such that the thyristors 11a and 11b are alternately turned on resulting in that the A.C. current shown in FIG. 6(e) flows in the transformer 14. Without control, the amplitude of the A.C. current would tend to increase to reach a large amplitude determined by a particular condition of the load (magnetron). At the timing $T_3$, when the amplitude of the A.C. current exceeds the predetermined amplitude $TH_2$, the current amplitude sensor 15 is actuated to deactivate the thyristor control unit 17 and activate the thyristor control unit 19. Thus, at the next timing $T_4$, the control signal is not applied to the gate of the thyristor 11a but the control signal shown in FIG. 6(c) is applied to the gate of the thyristor 11c.

Figure 10:
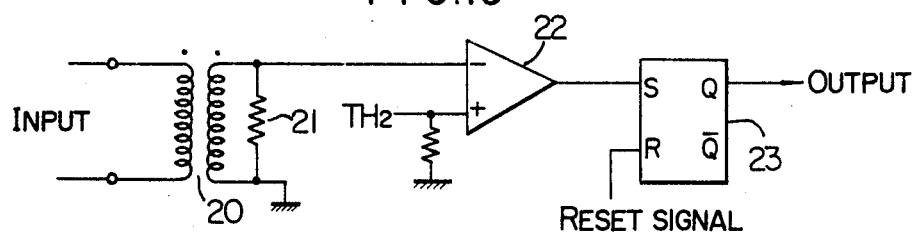
FIG. 10 shows a current amplitude sensor for detecting a current supplied to a transformer.
Figure 9:
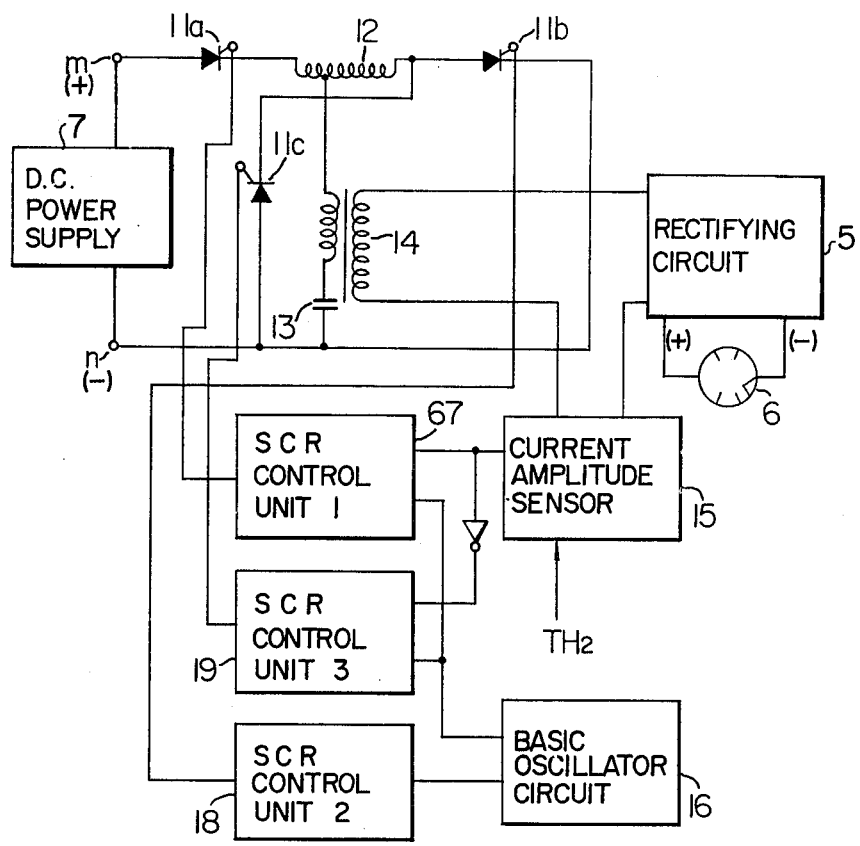

FIG. 10 shows an example of the current amplitude sensor 15 for detecting the threshold $TH_2$. In FIG. 10, numeral 20 denotes a step-up transformer having input terminals thereof connected to one end of the transformer 14 and a junction of diodes 5b and 5c, respectively, and numeral 21 denotes a detecting resistor for detecting the transformer current. One end of the detecting resistor 21 is connected to a comparator 22, an output of which is connected to one input terminal of a flip-flop 23. When the amplitude of the current flowing in the transformer 14 exceeds the reference current level $TH_2$ of the comparator 22, the comparator 22 produces an output, which causes the flip-flop 23 to be reversed. The thyristor control units 17 and 19 respond to the output of the flip-flop 23 to fire the thyristor 11c and extinguish the thyristor 11a. Thus, the thyristor 11a is turned off while the thyristor 11c is turned on, and the current flowing from the positive potential terminal m through the thyristor 11a, the reactor 12, the transformer 14 and the capacitor 13 is blocked and a discharging current flows through the thyristor 11c, the reactor 12, the transformer 14 and the capacitor 13 by charge stored in the capacitor 13. Since no power is supplied from the positive terminal m, the current amplitude decreases and the charge stored in opposite direction to the capacitor 13 decreases so that the current amplitude in the next cycle decreases. By repeating the above operation, the current amplitude is prevented from increasing to a large amplitude determined by the load and it is limited below a given amplitude.

Figure 11:
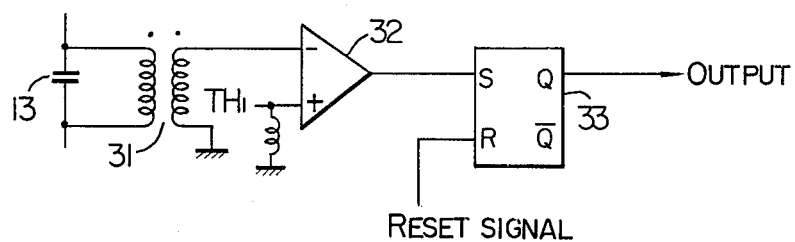
FIG. 11 shows a voltage amplitude sensor for sensing a voltage across capacitor.

In the operation explained above, the level $TH_2$ is preset to detect when the current flowing in the transformer 14 exceeds that level to produce the control signal shown in FIG. 6(c). Alternatively, a level $TH_1$ may be preset to detect when the voltage across the capacitor 13 exceeds that level to produce the control signal shown in FIG. 6(c). FIG. 11 shows an example of a voltage sensor which produces a detection signal when the voltage across the capacitor 13 exceed the reference level $TH_1$. A step-down transformer 31 is connected across the capacitor 13. An output winding of the step-down transformer 31 is connected to an input terminal of a comparator 32. When the voltage across the capacitor 13 exceeds the reference level $TH_1$, the comparator 32 produces an output, which causes a flip-flop 33 to be reversed. The output of the flip-flop 33 is applied to the thyristor control units to control the thyristors 11a and 11c in the same manner as described above.

Referring now to FIGS. 7(a) to (e), another control mode for the circuit shown in FIG. 5 is explained. The waveforms shown in FIGS. 7(a) to (e) correspond to those in FIGS. 6(a) to (e), respectively.

Figure 7:
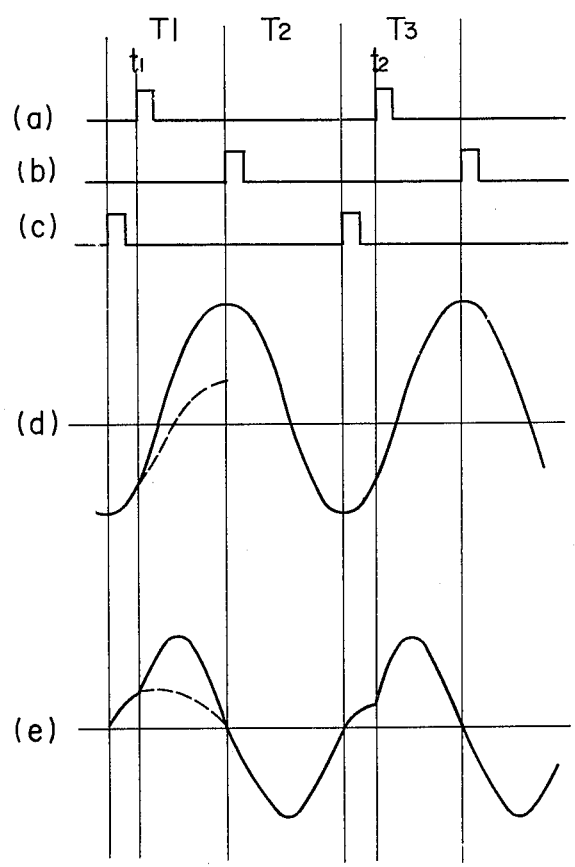
FIG. 7 shows waveforms for explaining another mode of operation of the power supply circuit of FIG. 5.

At the timing $T_1$ in the initial stage of the operation, the thyristor 11c is turned on by the control signal shown in FIG. 7(c) and a current starts to flow by the charge stored in the capacitor 13. At the timing $t_1$ within the range of the timing $T_1$, the control signal shown in FIG. 7(a) is produced to turn on the thyristor 11a. As a result, the thyristor 11c is reverse-biased and turned off so that the power from the terminal m is supplied to the transformer 14. Then, at the next timing $T_2$, the control signal shown in FIG. 7(b) is produced to turn on the thyristor 11b. By repeating the above cycle of operation under the control of the basic oscillator circuit 16, a substantially sinusoidal A.C. wave, although slightly distorted, is obtained. By changing the ratio of the timing $T_1$ and the timing $t_1$, the current amplitude can be controlled to obtain a constant amplitude. More particularly, in the present embodiment, by changing the ratio of the timings $t_1, t_2, \ldots$ at which the thyristor 1a is turned on to the timings $T_1, T_2, \ldots$ within the range of the timings $T_1$, $T_3$, ..., the variation of the current amplitude for each timing can be minimized and the power can be precisely controlled, although the control is somewhat complex.

The present invention can be implemented only by the switching elements such as the thyristors, the current or voltage sensor and the logic circuit responsive thereto. When the power supply derived by rectifying the commercial line voltage is used as the input power supply, chokes and capacitors in the filter circuit may be omitted. This results in a reduction in cost. In addition, the variation of output power of the magnetron and the breakage thereof due to the variation of current or excessive current to the magnetron are prevented and the reliability of the magnetron is enhanced.

Figure 8:
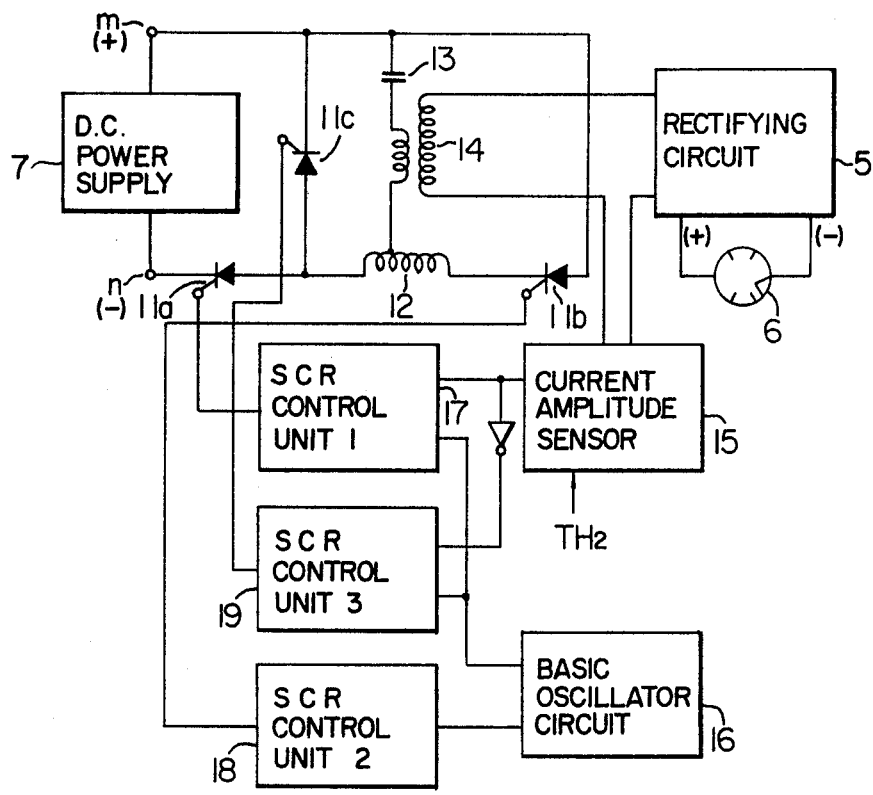
FIGS. 8 and 9 show other embodiments of the present invention.

The relations between the thyristors 11a to 11c and the other components in the present invention are not limited to those illustrated in FIG. 5 but they may be established in a manner shown in FIG. 8.

Further, the cathode of the thyristor 11c may be connected to the junction of the reactor 12 and the thyristor 11b.

What is claimed is:

1. A power supply circuit comprising:
    an inverter circuit including first and second switching elements adapted to be alternately turned on, a commutating reactor connected in series with said switching elements, and at least one commutating capacitor connected to a center tap of said commutating reactor;
    a transformer having a primary winding connected to an output of said inverter circuit and a secondary winding;
    a third switching element connected in parallel with a series circuit including said commutating capacitor, said primary winding and a portion of said commutating reactor; and
    control means for controlling the operation of said first, second and third switching elements;
    said third switching element being energized by said control means to establish a discharging loop for said commutating capacitor through said series circuit, whereby an amplitude of a current supplied to said transformer is limited below a predetermined level.

2. A power supply circuit according to claim 1 further including:
    a current amplitude sensor electrically connected to an output of said transformer and said control means for supplying a detection output to said control means when the amplitude of the current flowing in said transformer exceeds a predetermined level,
    said control means being operative to respond to said detection output to turn off said first switching element which is to be turned on when the current in said transformer does not exceed said predetermined level and turn on said third switching element to establish said discharging loop for said commutating capacitor.

3. A power supply circuit according to claim 1 further including;
    a voltage amplitude sensor electrically connected to said commutating capacitor and said control means for supplying a detection output to said control means when the amplitude of the voltage across said commutating capacitor exceeds a predetermined level,
    said control means being operative to respond to said detection output to turn off said first switching element which is to be turned on when the voltage across said commutating capacitor does not exceed said predetermined level and turn on said third switching element to establish said discharging loop for said commutating capacitor.

4. A power supply circuit according to claim 1 wherein said control means is operative to turn on said first, second and third switching elements at a given period and control a time interval from the turn-on of said third switching element to the turn-on of said first switching element or a time interval from the turn-on of said third switching element to the turn-on of said second switching element.

5. A power supply circuit according to claim 1 wherein an output of a secondary winding of said transformer is supplied to a magnetron.

6. A power supply circuit according to claim 1 wherein said inverter circuit comprises a single-phase series type inverter.

7. A power supply circuit according to claim 1, wherein said control means is responsive to the current supplied to said transformer exceeding a predetermined level for energizing said third switching element.

8. A power supply circuit according to claim 7, wherein said control means inhibits energization of said first switching element when enabling energization of said third switching element.

9. A power supply circuit according to claim 1, where only a single third switching element is connected in parallel with said series circuit.

* * * * *